(12) United States Patent
Hokenmaier

(10) Patent No.: US 8,743,600 B2
(45) Date of Patent: Jun. 3, 2014

(54) PROCESSORS AND SYSTEMS USING CELL-REFRESHED PHASE-CHANGE MEMORY

(71) Applicant: Being Advanced Memory Corporation, Essex Junction, VT (US)

(72) Inventor: Wolfgang Hokenmaier, Bulington, VT (US)

(73) Assignee: Being Advanced Memory Corporation, Williston, VT (US)

( * ) Notice: Subject to any disclaimer, the term of this patent is extended or adjusted under 35 U.S.C. 154(b) by 0 days.

(21) Appl. No.: 13/869,074

(22) Filed: Apr. 24, 2013

(65) Prior Publication Data

US 2013/0336048 A1    Dec. 19, 2013

Related U.S. Application Data

(60) Provisional application No. 61/637,518, filed on Apr. 24, 2012, provisional application No. 61/784,550, filed on Mar. 14, 2013.

(51) Int. Cl.
*G11C 11/00* (2006.01)
*G11C 13/00* (2006.01)

(52) U.S. Cl.
CPC ................................ *G11C 13/0004* (2013.01)
USPC ......................................... 365/163; 365/148

(58) Field of Classification Search
CPC ........................ G11C 13/0004; G11C 13/0069
USPC ...................... 365/163, 148, 189.07
See application file for complete search history.

(56) References Cited

U.S. PATENT DOCUMENTS 7,385,868 B2 *   6/2008   Moore et al. ................. 365/222

FOREIGN PATENT DOCUMENTS

| CN | 102270505 A | 12/2011 |
|---|---|---|
| CN | 102332302 A | 1/2012 |
| CN | 102594315 A | 7/2012 |
| CN | 102637453 A | 8/2012 |
| CN | 103165179 A | 6/2013 |
| CN | 103165181 A | 6/2013 |

* cited by examiner

*Primary Examiner* — Huan Hoang
(74) *Attorney, Agent, or Firm* — Robert O. Groover, III; Seth A. Horwitz; Gwendolyn S. S. Groover

(57) ABSTRACT

Systems in which PCM is used, including memory systems, as well as methods for operating such systems. A comparison of PCM memory elements storing logical values to a trigger resistance or to each other can be used to determine the extent of resistance drift since the PCM memory elements were last written. If the comparison determines that the resistance drift has passed a sense margin threshold or a trigger resistance, a memory refresh is triggered and pre-drift resistances corresponding to the stored logical values are written to the PCM memory elements.

20 Claims, 16 Drawing Sheets

PROCESSORS AND SYSTEMS USING CELL-REFRESHED PHASE-CHANGE MEMORY

CROSS-REFERENCE

Priority is claimed from U.S. Provisional Patent Application 61/637,518 filed Apr. 24, 2012, which is hereby incorporated by reference.

Priority is claimed from U.S. Provisional Patent Application 61/784,550 filed Mar. 14, 2013, which is hereby incorporated by reference.

BACKGROUND

The present application relates to systems, devices and methods for improving memory integrity in phase change memory units.

Note that the points discussed below may reflect the hindsight gained from the disclosed inventions, and are not necessarily admitted to be prior art.

Phase change memory ("PCM") is a relatively new nonvolatile memory technology, which is very different from any other kind of nonvolatile memory. First, the fundamental principles of operation, at the smallest scale, are different: no other kind of solid-state memory uses a reversible PHYSICAL change to store data. Second, in order to achieve that permanent physical change, an array of PCM cells has to allow read, set, and reset operations which are all very different from each other. The electrical requirements of the read, set, and reset operations make the peripheral circuit operations of a PCM very different from those of other nonvolatile memories. Obviously some functions, such address decoding and bus interface, can be the same; but the closest-in parts of the periphery, which perform set, reset, and read operations on an array or subarray, must satisfy some unique requirements.

The physical state of a PCM cell's memory material is detected as resistance. For each selected cell, its bitline is set to a known voltage, and the cell's access transistor is turned on (by the appropriate wordline). If the cell is in its low-resistance state, it will sink a significant current from the bit line; if it is not, it will not.

Set and Reset operations are more complicated. Both involve heat. As discussed below, a "set" operation induces the memory material to recrystallize into its low-resistance (polycrystalline) state; a "reset" operation anneals the memory material into its high-resistance (amorphous) state.

Write operations (Set and Reset) normally have more time budget than read operations. In read mode a commercial PCM memory should be competitive with the access speed (and latency if possible) of a standard DRAM. If this degree of read speed can be achieved, PCM becomes very attractive for many applications.

The phase change material is typically a chalcogenide glass, using amorphous and crystalline (or polycrystalline) phase states to represent bit states.

A complete PCM cell can include, for example: a top electrode (connected to the bit line), a phase change material (e.g. a chalcogenide glass), a conductive pillar which reaches down from the bottom of the phase change material, an access transistor (gated by a word line), and a bottom connection to ground. The phase change material can extend over multiple cells (or over the whole array), but the access transistors are laterally isolated from each other by a dielectric.

FIG. 2A shows an example of a PCM element 2010. A top electrode 2020 overlies a phase change material 2030, e.g. a chalcogenide glass. Note that material 2030 also includes a mushroom-shaped annealed zone (portion) 2070 within it. (The annealed zone 2070 may or may not be present, depending on what data has been stored in this particular location.) The annealed zone 2070, if present, has a much higher resistivity than the other (crystalline or polycrystalline) parts of the material 2030.

A conductive pillar 2050 connects the material 2030 to a bottom electrode 2040. In this example, no selection device is shown; in practice, an access transistor would normally be connected in series with the phase change material. The pillar 2050 is embedded in an insulator layer 2060.

When voltage is applied between the top 2020 and bottom 2040 electrodes, the voltage drop will appear across the high-resistivity zone 2070 (if present). If sufficient voltage is applied, breakdown will occur across the high-resistivity zone. In this state the material will become very conductive, with large populations of mobile carriers. The material will therefore pass current, and current crowding can occur near the top of the pillar 2050. The voltage which initiates this conduction is referred to as the "snapback" voltage, and FIG. 2C shows why.

FIG. 2C shows an example of instantaneous I-V curves for a device like that of FIG. 2A, in two different states. Three zones of operation are marked.

In the zone 2200 marked "READ," the device will act either as a resistor or as an open (perhaps with some leakage). A small applied voltage will result in a state-dependent difference in current, which can be detected.

However, the curve with open circles, corresponding to the amorphous state of the device, shows some more complex behaviors. The two curves show behaviors under conditions of higher voltage and higher current.

If the voltage reaches the threshold voltage $V_{th}$, current increases dramatically without any increase in voltage. (This occurs when breakdown occurs, so the phase-change material suddenly has a large population of mobile carriers.) Further increases in applied voltage above $V_{th}$ result in further increases in current; note that this upper branch of the curve with hollow circles shows a lower resistance than the curve with solid squares.

If the applied voltage is stepped up to reach the zone 2150, the behavior of the cell is now independent of its previous state.

When relatively large currents are applied, localized heating will occur at the top of the pillar 2050, due to the relatively high current density. Current densities with typical dimensions can be in the range of tens of millions of Amperes per square cm. This is enough to produce significant localized heating within the phase-change material.

This localized heating is used to change the state of the phase-change material, as shown in FIG. 2B. If maximum current is applied in a very brief pulse 2100 and then abruptly stopped, the material will tend to quench into an amorphous high-resistivity condition; if the phase-change material is cooled more gradually and/or not heated as high as zone 2150, the material can recrystallize into a low-resistivity condition. Conversion to the high-resistance state is normally referred to as "Reset", and conversion to the low-resistance state is normally referred to as "Set" (operation 2080). Note that, in this example, the Set pulse has a tail where current is reduced fairly gradually, but the Reset pulse does not. The duration of the Set pulse is also much longer than that of the Reset pulse, e.g. tens of microseconds versus hundreds of nanoseconds.

FIG. 2D shows an example of temperature versus resistivity for various PCM materials. It can be seen that each curve has a notable resistivity drop 2210 at some particular temperature. These resistivity drops correspond to phase change to a crystalline (or polysilicon) state. If the material is cooled gradually, it remains in the low resistivity state after cooling.

In a single-bit PCM, as described above, only two phases are distinguished: either the cell does or does not have a significant high-resistivity "mushroom cap" 2070. However, it is also possible to distinguish between different states of the mushroom cap 2070, and thereby store more than one bit per cell.

FIG. 2E shows an equivalent circuit for an "upside down" PCM cell 2010. In this example the pass transistor 2240 is gated by Wordline 2230, and is connected between the phase-change material 2250 and the bitline 2220. (Instead, it is somewhat preferable to connect this transistor between ground and the phase-change material.

FIG. 2F shows another example of a PCM cell 2010. A bitline 2220 is connected to the top electrode 2020 of the phase-change material 2250, and transistor 2240 which is connected to the bottom electrode 2030 of the PCM element. (The wordline 2230 which gates the vertical transistor 2240 is not shown in this drawing.) Lines 2232, which are shown as separate (and would be in a diode array), may instead be a continuous sheet, and provide the ground connection.

FIG. 2G shows an example of resistance (R) over time (t) for a single PCM cell following a single PCM write event at time t=0. The resistance curve 2400 for a cell which has been reset (i.e. which is in its high-resistance state) may rise at first, but then drifts significantly lower. The resistance curve 2410 for a cell in the Set state is much flatter. The sense margin 2420, i.e., the difference between set and reset resistances, also decreases over time. Larger sense margins generally result in more reliable reads, and a sense margin which is too small may not permit reliable reading at all. 2G represents the approximate behavior of one known PCM material; other PCM material compositions may behave differently. For example, other PCM material compositions may display variation of the set resistance over time.

The downwards drift of reset resistance may be due to, for example, shrinking size of the amorphous zone of the phase-change material, due to crystal growth; and, in some cells, spontaneous nucleation steepening the drift curve (possibly only slightly) due to introducing further conductive elements into the mushroom-shaped programmable region.

FIG. 2H shows an example of a processing system 2300. Typically, a processing system 2300 will incorporate at least some of interconnected power supplies 2310, processor units 2320 performing processing functions, memory units 2330 supplying stored data and instructions, and I/O units 2340 controlling communications internally and with external devices 2350.

FIG. 2I shows an example of a PCM single ended sensing memory. Two different PCM cells 2400 on different ends of a sense amplifier can be selected separately. Selected elements 2410 are separately sensed by a single-ended sense amplifier 2420.

FIG. 2J shows an example of a known PCM single ended sense amplifier 2500. Generally, in a single ended sense amplifier, a cell read output conducted by a selected bitline BLB is compared against a reference current to provide a digital output OUT. When the PRECHARGE signal turns on transistor 2530, voltage V04 (e.g., 400 mV) precharges the bitline BLB. After precharge ends, the READ signal turns on transistor 2550. Transistor 2550 is connected, through source follower 2560 and load 2580, to provide a voltage which comparator 2600 compares to Voltage_REF, to thereby generate the digital output OUT.

A variety of nonvolatile memory technologies have been proposed over recent decades, and many of them have required some engineering to provide reference values for sensing. However, the requirements and constraints of phase-change memory are fundamentally different from those of any other kind of nonvolatile memory. Many memory technologies (such as EEPROM, EPROM, MNOS, and flash) test the threshold voltage of the transistor in a selected cell, so referencing must allow for the transistor's behavior. By contrast, phase-change memory simply senses the resistance of the selected cell. This avoids the complexities of providing a reference which will distinguish two (or more) possibilities for an active device's state, but does require detecting a resistance value, and tracking external variations (e.g. temperature and supply voltage) which may affect the instantaneous value of that resistance.

SUMMARY

In phase change memories, the reset resistance of a PCM cell is not constant, but rather degrades over time after being written. This can be for a variety of reasons, but is generally due to the inherent thermal sensitivity of PCM cells. Increased PCM cell temperatures can lead to data degradation. This can be from, e.g., increased ambient or operating temperatures. Self-heating resulting from frequent repeated read and write accesses of the cell or read/write cycles to neighboring cells can also speed PCM cell degradation. The reset resistance can generally only be differentiated from the set resistance if the reset resistance is more than a minimum sense margin above the set resistance. When the memory cell's reset resistance falls below the minimum sense margin, the memory cell is unreadable and its data is unrecoverable.

The present application teaches that to combat this thermal degradation, the PCM cell is refreshed periodically, wherein the information is read and rewritten back onto the cell (using a set or reset operation). This sets the PCM cell's data retention time back to zero. Therefore, if the falling reset resistance can be detected before it falls below the critical sense margin, the PCM cell can be refreshed without losing the data.

However, refresh operations can themselves contribute to thermal degradation, if not of the cell being immediately refreshed then of the surrounding cells or even of the chip as a whole. Therefore, the present application teaches that refresh is preferably performed only under special circumstances—e.g. when it has been determined that a refresh is necessary.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The disclosed innovations, in various embodiments, provide one or more of at least the following advantages. However, not all of these advantages result from every one of the innovations disclosed, and this list of advantages does not limit the various claimed inventions.

Provides more accurate memory reads;
triggers refresh when necessary to preserve data integrity;
lessens error correction requirements;
avoids need to reload data from remote storage due to unreadable stored data;
improves manufacturing logistics, since data can be written before soldering or packaging; and
improves temperature tolerance.

In phase change memories, the reset resistance of a PCM cell is not constant, but rather degrades over time after being written. This can be for a variety of reasons, but is generally due to the inherent thermal sensitivity of PCM cells. Increased PCM cell temperatures can lead to data degradation. This can be from, e.g., increased ambient or operating temperatures. Self-heating resulting from frequent repeated read and write accesses of the cell or read/write cycles to neighboring cells can also speed PCM cell degradation. The reset resistance can generally only be differentiated from the set resistance if the reset resistance is more than a minimum sense margin above the set resistance. When the memory cell's reset resistance falls below the minimum sense margin, the memory cell is unreadable and its data is unrecoverable.

Figure 2A:
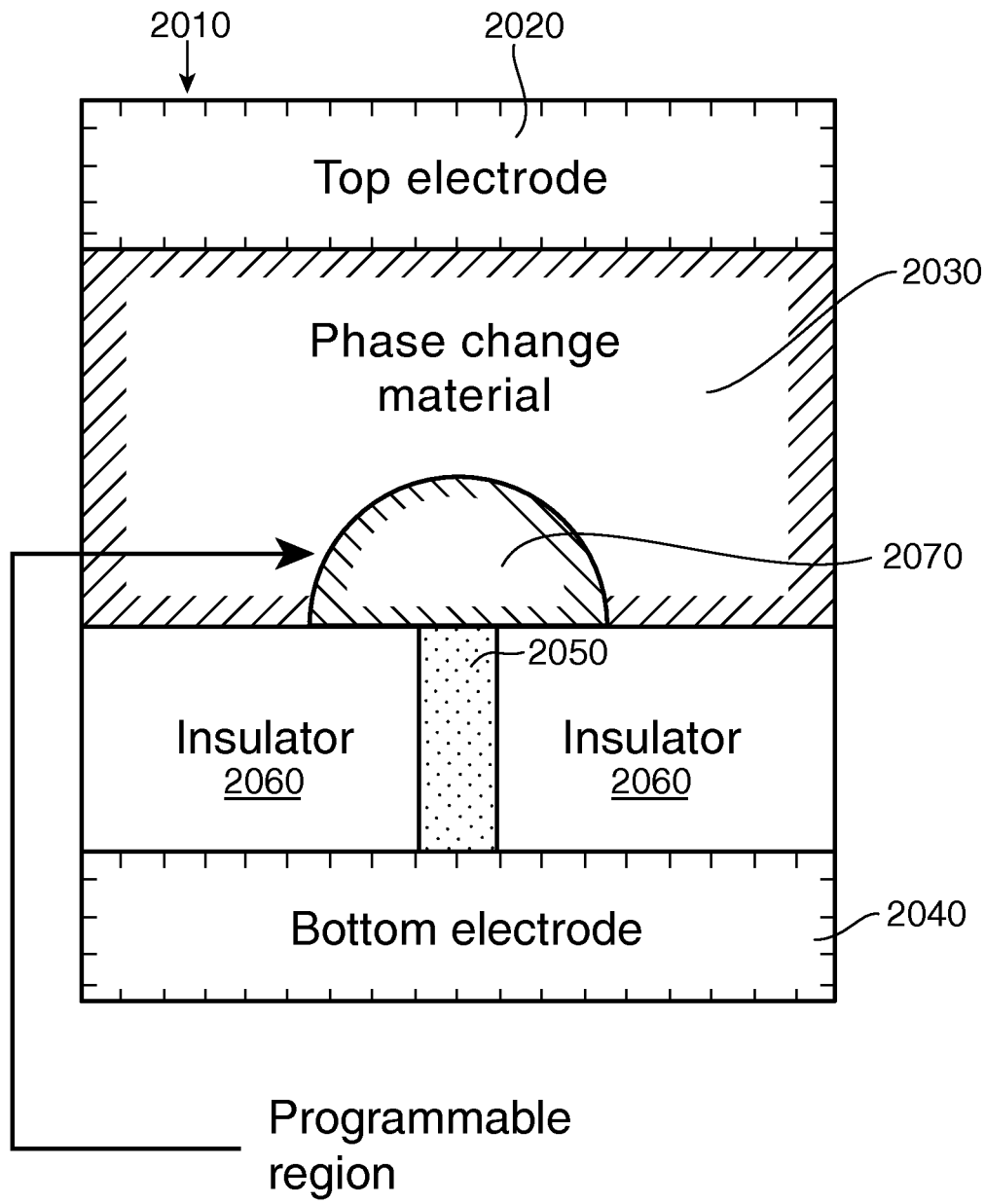
FIG. 2A shows an example of a PCM element.
Figure 2B:
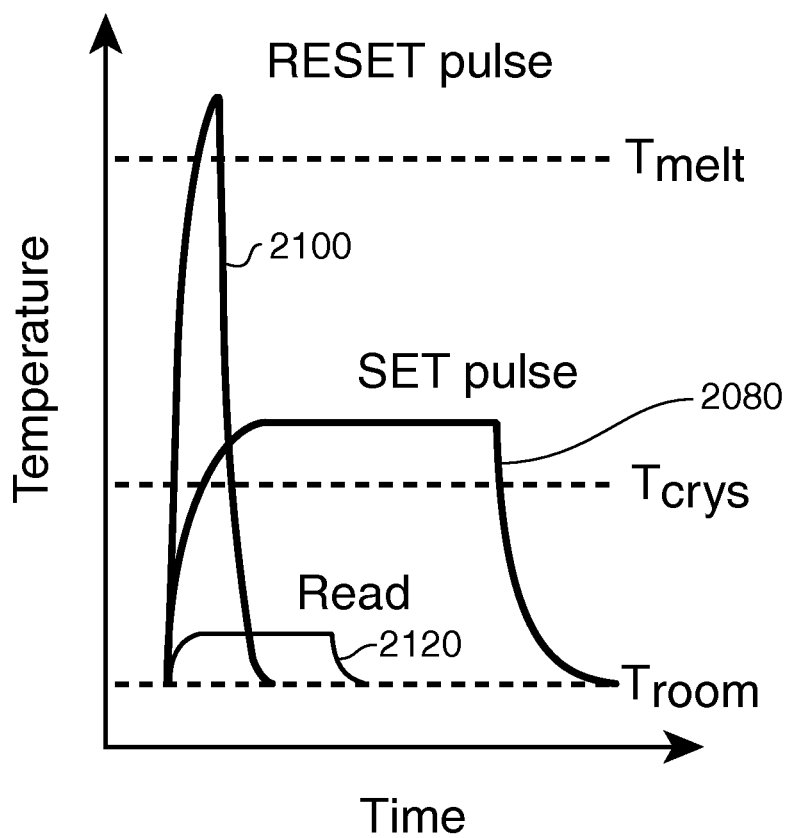
FIG. 2B shows an example of PCM bit line signals.
Figure 2C:
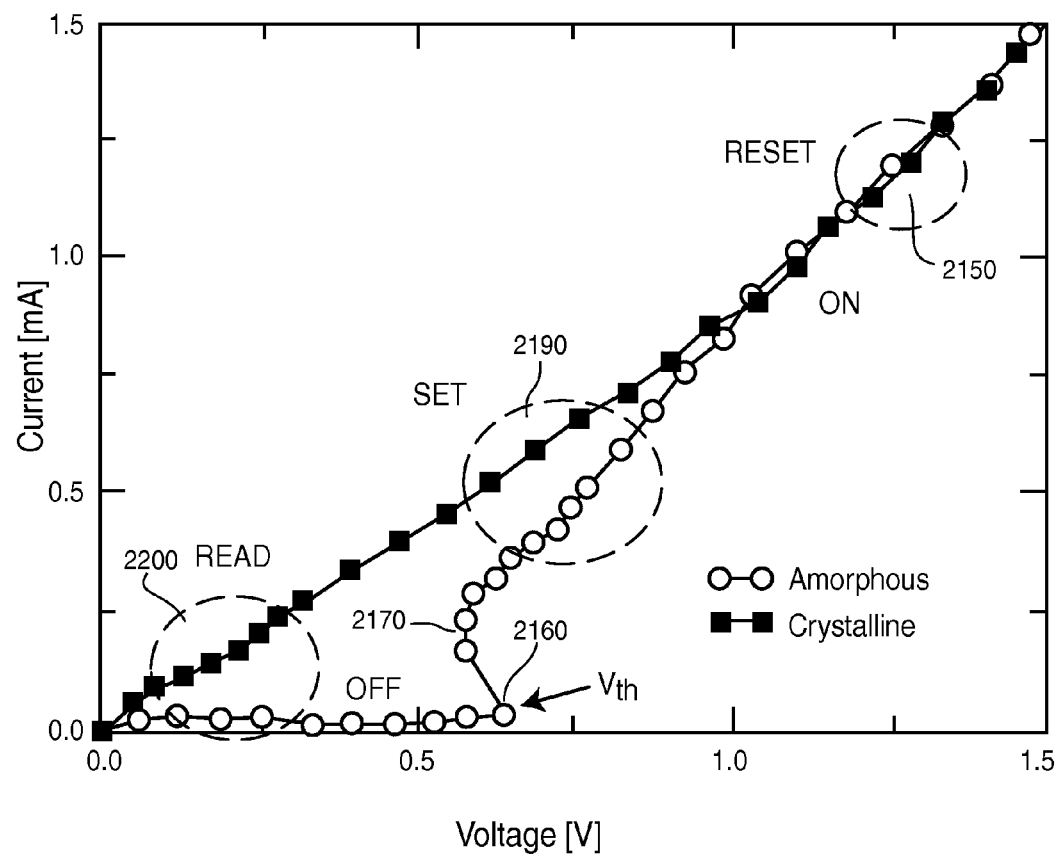
FIG. 2C shows an example of voltage versus current in a PCM material.
Figure 2D:
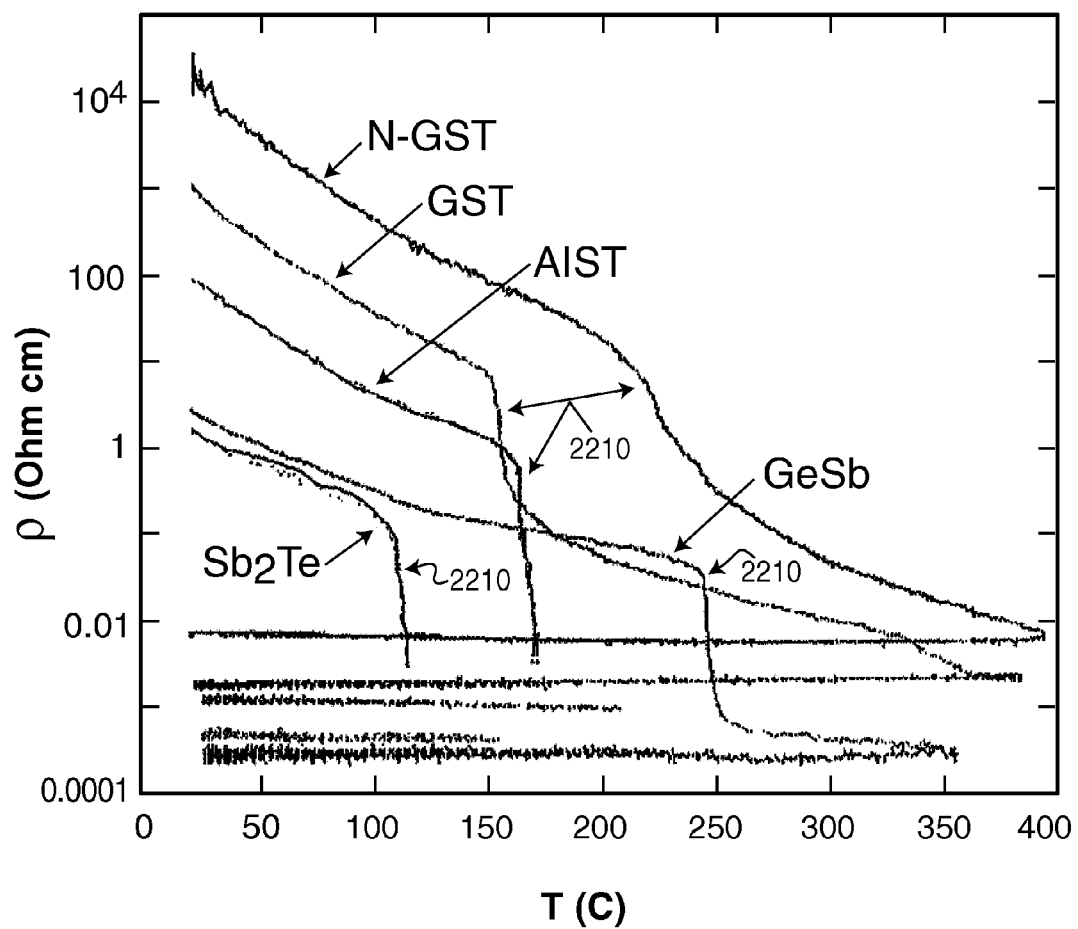
FIG. 2D shows an example of temperature versus resistance in a PCM material.
Figure 2E:
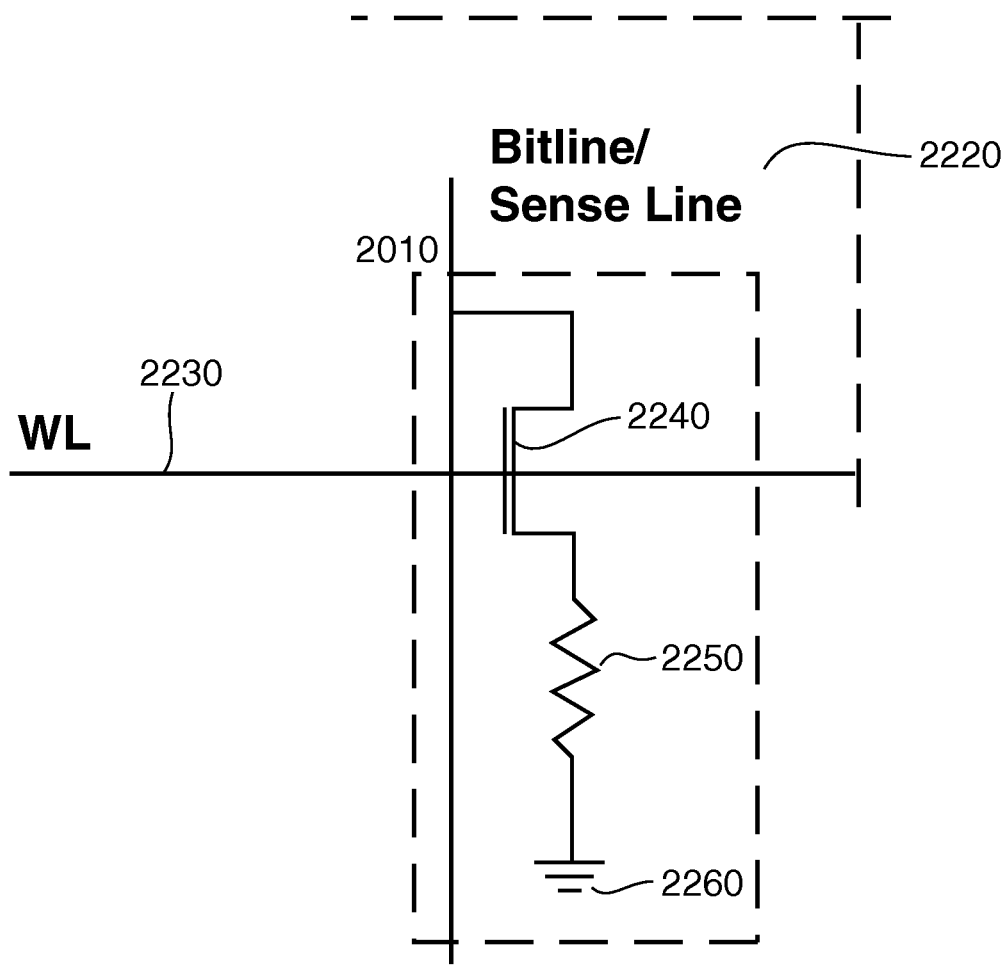
FIG. 2E shows an example of a PCM cell.
Figure 2F:
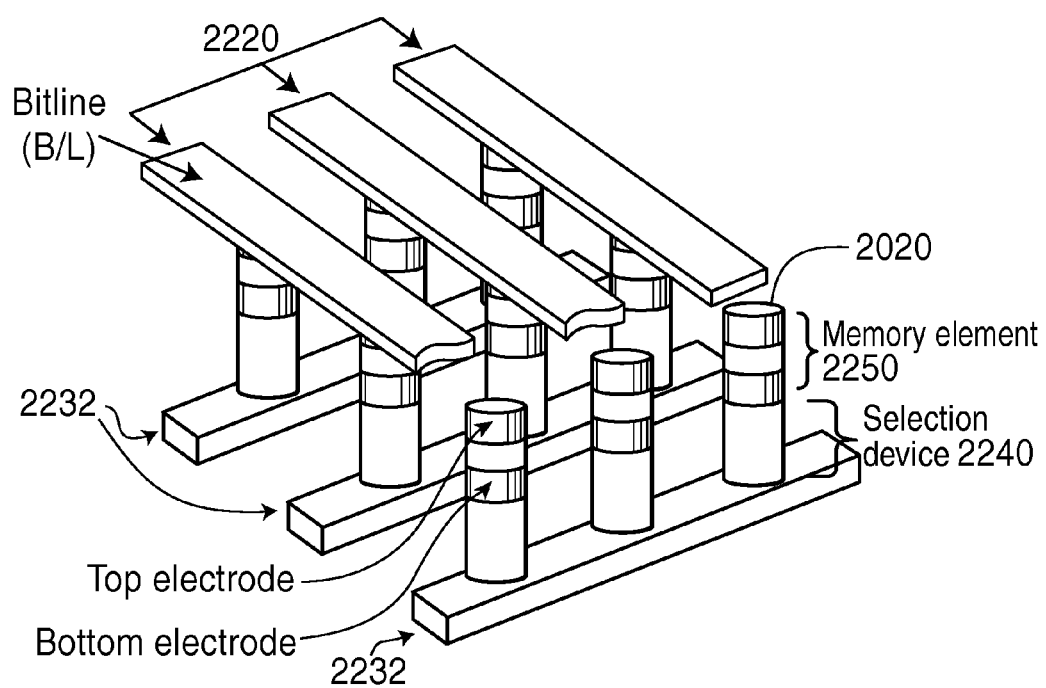
FIG. 2F shows an example of a PCM cell.
Figure 2G:
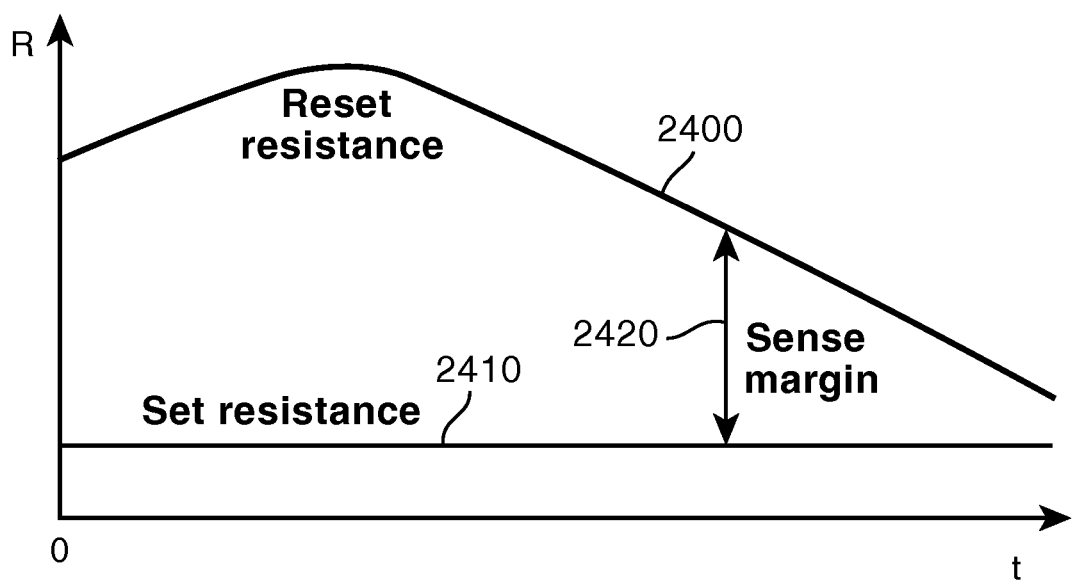
FIG. 2G shows an example of resistance over time for a PCM cell.

An example of resistance variation over time is shown in FIG. 2G, but it is not enough to know the typical time for the resistance to fall below the sense margin. This resistance profile can be quite unpredictable, and can vary greatly depending on, e.g., the operating conditions, the temperature history of the chip, and the access frequency of the cell and its environs.

The present application teaches that to combat this thermal degradation, the PCM cell is refreshed periodically, wherein the information is read and rewritten back onto the cell (using a set or reset operation). This sets the PCM cell's data retention time back to zero. Therefore, if the falling reset resistance can be detected before it falls below the critical sense margin, the PCM cell can be refreshed without losing the data.

However, refresh operations can themselves contribute to thermal degradation, if not of the cell being immediately refreshed then of the surrounding cells or even of the chip as a whole. Therefore, the present application teaches that refresh is preferably performed only under special circumstances—e.g. when it has been determined that a refresh is necessary.

The present application teaches that one method of triggering refresh is by sensing the need for a refresh through reading of a single or a multitude of reference elements with known content at various or predetermined read resistance settings of the sense amplifier. This can be, for example, by having one cell which is the reset reference. This reference cell can be reset e.g. only when the subarray (or chip, as appropriate) is refreshed. The reference cell is then monitored periodically. When the resistance of this reference cell falls below some trigger resistance (which is preferably comfortably above the sense margin), this triggers a refresh cycle for the whole subarray.

The present application teaches that another method of triggering refresh is by sensing the need for refresh through comparison of a single or a multitude of reference elements to discrete resistor values. This can be achieved sequentially or in a differential/comparative manner.

In one class of implementations, when comparison against a threshold value indicates that resistances of PCM cells have drifted by more than a tolerance amount, the resistances stored by the PCM cells are read and then refreshed to pre-drift levels.

In another class of implementations, refresh is triggered whenever a bit error is discovered.

In yet another class of implementations, refresh is triggered in dependence on multiple factors, including: bit error occurrences; sense margin below a certain value; total number of bit resets; and time spent above some critical temperature (e.g. 125 C).

Phase change memory is inherently thermally sensitive, which can cause problems, such as skewing read and write results and causing resistance drift in PCM cells when a PCM memory unit is exposed to elevated ambient and/or operating temperatures. For example, packaging and soldering of electronic components deliver temperature profiles that can cause significant data degradation in Germanium-Antimony-Tellurium ("GST") and other PCM materials. Long-term elevated ambient temperatures and self-heating from frequent read and write accesses can also potentially elevate PCM memory temperatures sufficiently to degrade stored information through resistance drift. Because set and reset resistances require some minimum sense margin (difference between the resistances) to be distinguishable, resistance drift can lead to the data represented by a PCM cell's resistance becoming unrecoverable.

Though FIG. 2G shows an example resistance profile over time for a single PCM material composition, it is not enough to know a typical (mean, median, etc.) time for the resistance to fall below the sense margin. Resistance profiles of instantiated individual cells can vary unpredictably depending on, for example, the operating conditions, the temperature history of the chip, and the access frequency of the cell and proximal memory elements.

Figure 3:
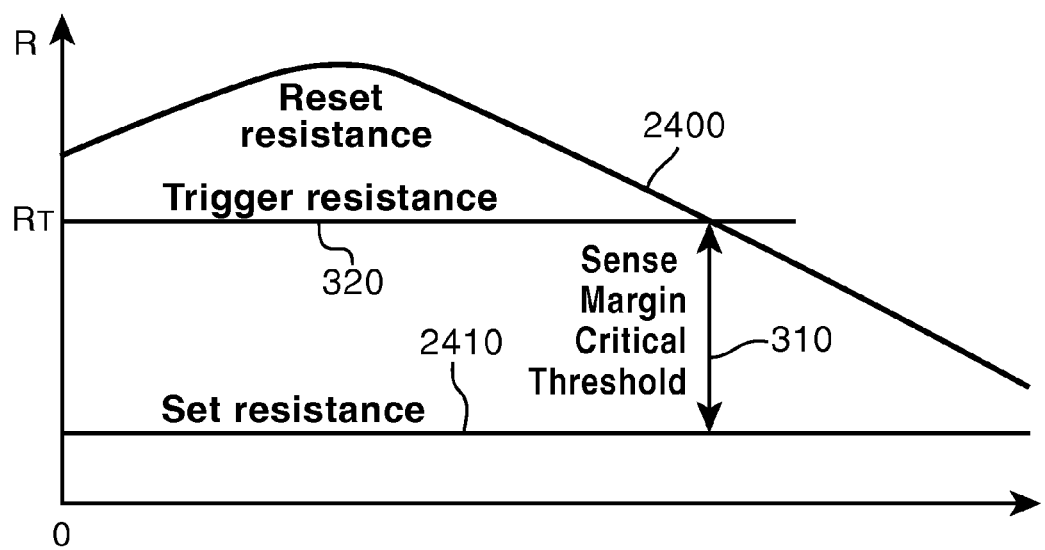
FIG. 3 shows an example of resistance over time for a PCM cell.

The contents of PCM cells can be refreshed—read, and then rewritten with the same logical values as previously stored but with pre-drift resistance characteristics—in order to manage and mitigate degradation of cell information. As shown in FIG. 3, this results in, essentially, resetting time after PCM cell write to t=0.

Advantageously, refresh is performed before data stored by the PCM becomes unrecoverable, for example, when resistance drift results in sense margins small enough that sense amplifiers are unable to reliably discriminate between resistances corresponding to different logical values stored by PCM cells (this can include taking into account additional tolerance factors such as error correction logic). Practically, this can be done by, e.g., making comparisons against a threshold resistance or sense margin (representing a critical amount of drift). Generally, PCM memory elements storing unrecoverable data can not be refreshed from their own contents, but rather need to be reprogrammed from external data sources, which can cost a significant amount of system time (when possible at all).

However, refresh operations can themselves contribute to thermal degradation, if not of the cell being immediately refreshed then of the surrounding cells or even of the chip as a whole. Therefore, the present application teaches that refresh is preferably performed only under special circumstances—e.g. when it has been determined that a refresh is necessary.

In some embodiments, read outputs of pairs of PCM cells known to store different adjacent logical values (e.g., SET and RESET for two-state PCM materials) are compared to each other to determine whether the sense margin has fallen below a critical threshold. For example, for read output currents A (SET) and B (RESET), if current A multiplied by a fraction derived from the critical threshold is determined to be less than current B, then resistance drift has progressed past the critical threshold and a refresh is necessary.

In some embodiments the PCM memory contains one or more discrete memory elements with known resistances as well as one or more reference cells with known content. The memory reads the reference cells and compares their resistance values with the known discrete resistors. The discrete resistor values are chosen such that at least one of them represents a memory element near enough to exhaustion due to resistance drift that a refresh is considered necessary ("trigger resistance").

Memory cells with known content can be, for example, a spare cell in a data word, or a cell in a "fuse row", which is generally a row containing configuration information such as repair, voltage trimming and test modes.

Checking a cell with known content for drift can occur by, for example, temporarily trimming a corresponding sense amplifier to a higher resistance threshold, to force failure for "weaker" cells which have decayed but not to the point of failing in a normal read; or by comparing against discrete resistors (e.g., resistance trims), without relying on the accuracy of the trimming, which may be slightly different for different devices (e.g., different chips). The discrete resistor is more stable, generally only subject to process variations—which can be minimized—whereas trimming may be dependent on other factors, such as individually trimmed reference voltages or currents.

Alternatively (though generally, less preferred), comparison can also be made against a newly refreshed cell. In such an embodiment, slight variations across cells may result in a differential preference when comparing a drifting cell to a newly refreshed cell. It would then, generally, be advantageous to skew the comparator/sense amplifier to ensure the detection of a minimum difference specified as significant.

Comparisons determining whether refresh is necessary can be performed, for example, during power-on, at periodic intervals, or during particular events such as reads or writes to the same or different portions (e.g., subarrays) of the memory.

Figure 1:
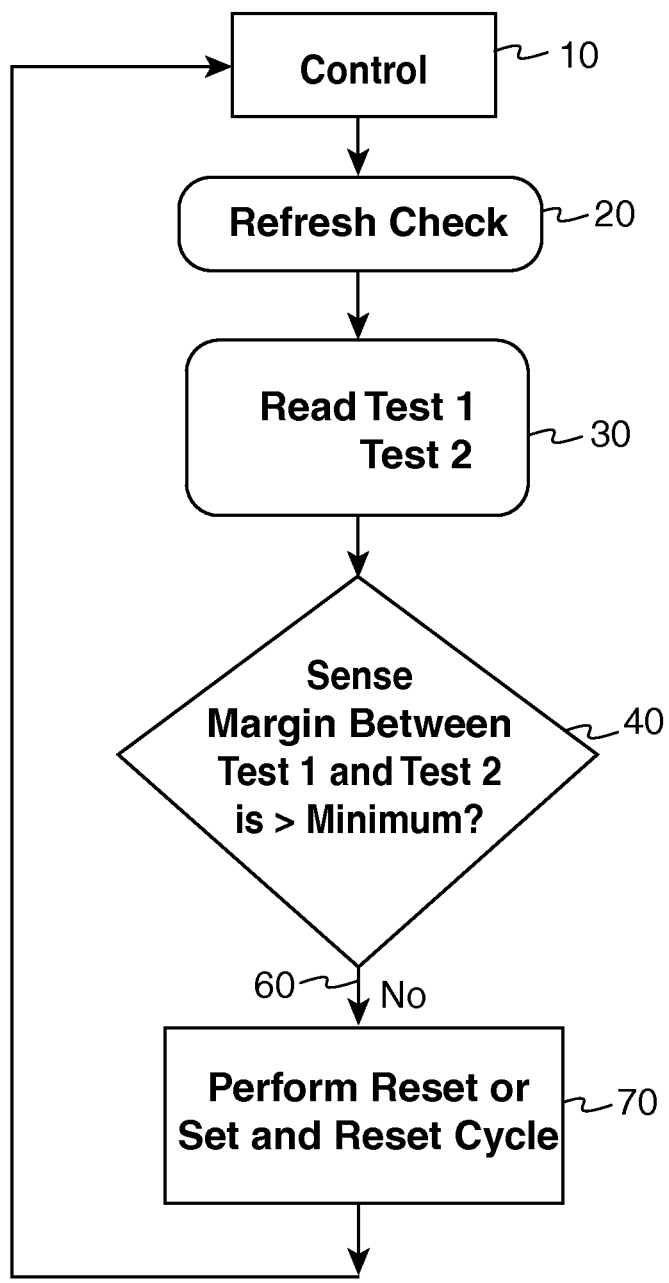
FIG. 1 shows an example of a PCM memory refresh process.

FIG. 1 shows an example of a PCM memory refresh process. A refresh control 10 causes a refresh check to be initiated 20. This can happen, for example, during a response to a memory read request; on special events such as power-on, post-soldering or packaging; when temperature sensor output integrated into a temperature profile indicates excessive exposure over time of the PCM memory to elevated temperatures; after a certain number of PCM writes and/or reads; or at designated intervals. PCM test cells storing different adjacent logical values (such as SET and RESET in two-state PCM memory elements) Test1 and Test2 are then read 30. Test1 and Test2 and corresponding access logic may be substantially identical in composition to other PCM cells in the PCM memory, or may be configured to be more sensitive to drift or to provide a stronger read signal. Test1 and Test2 are then compared to each other to determine whether the sense margin between then is larger than a minimum critical threshold amount 40. If the sense margin is larger than the minimum 50, the process returns to control 10 to await another event triggering refresh check 20. If the sense margin is not larger than the minimum, then refresh control causes a reset—or set and reset—cycle to be performed 70. In other words, a refresh is performed by writing PCM cells storing reset, or all PCM cells (set and reset), with pre-drift resistances corresponding to the logical values the PCM cells currently store.

Figure 2H:
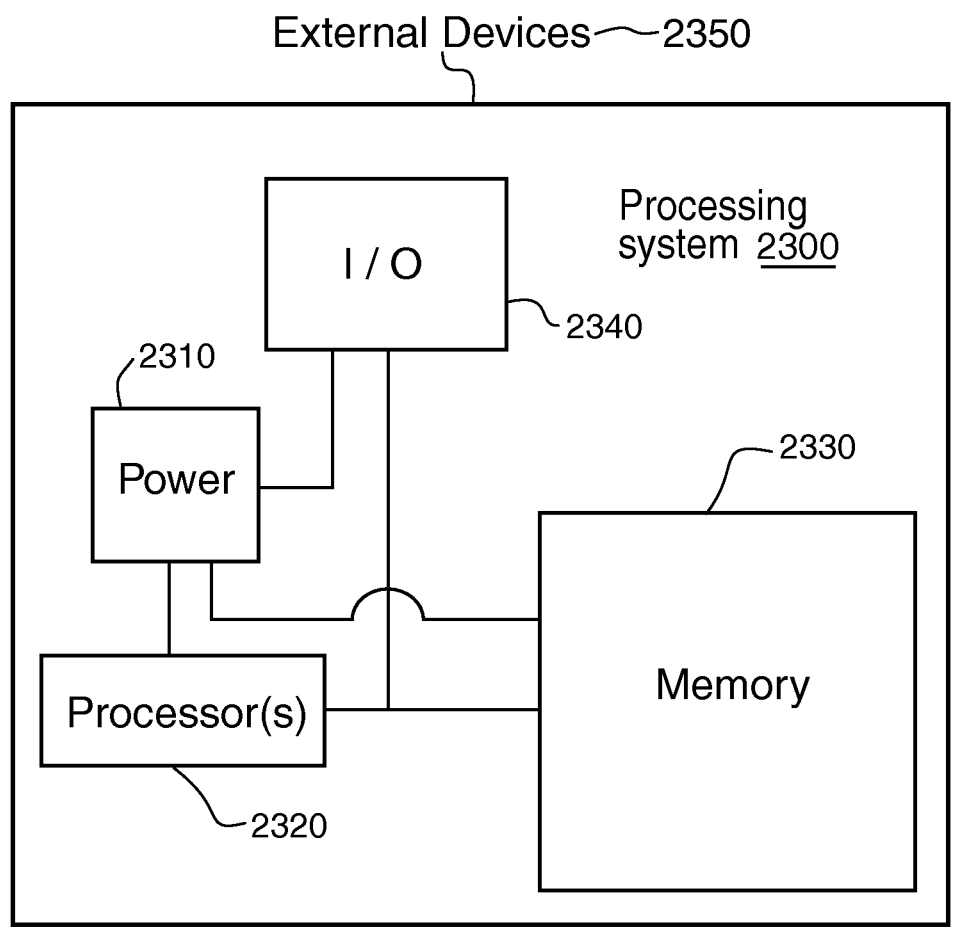
FIG. 2H shows an example of a processing system.
Figure 2I:
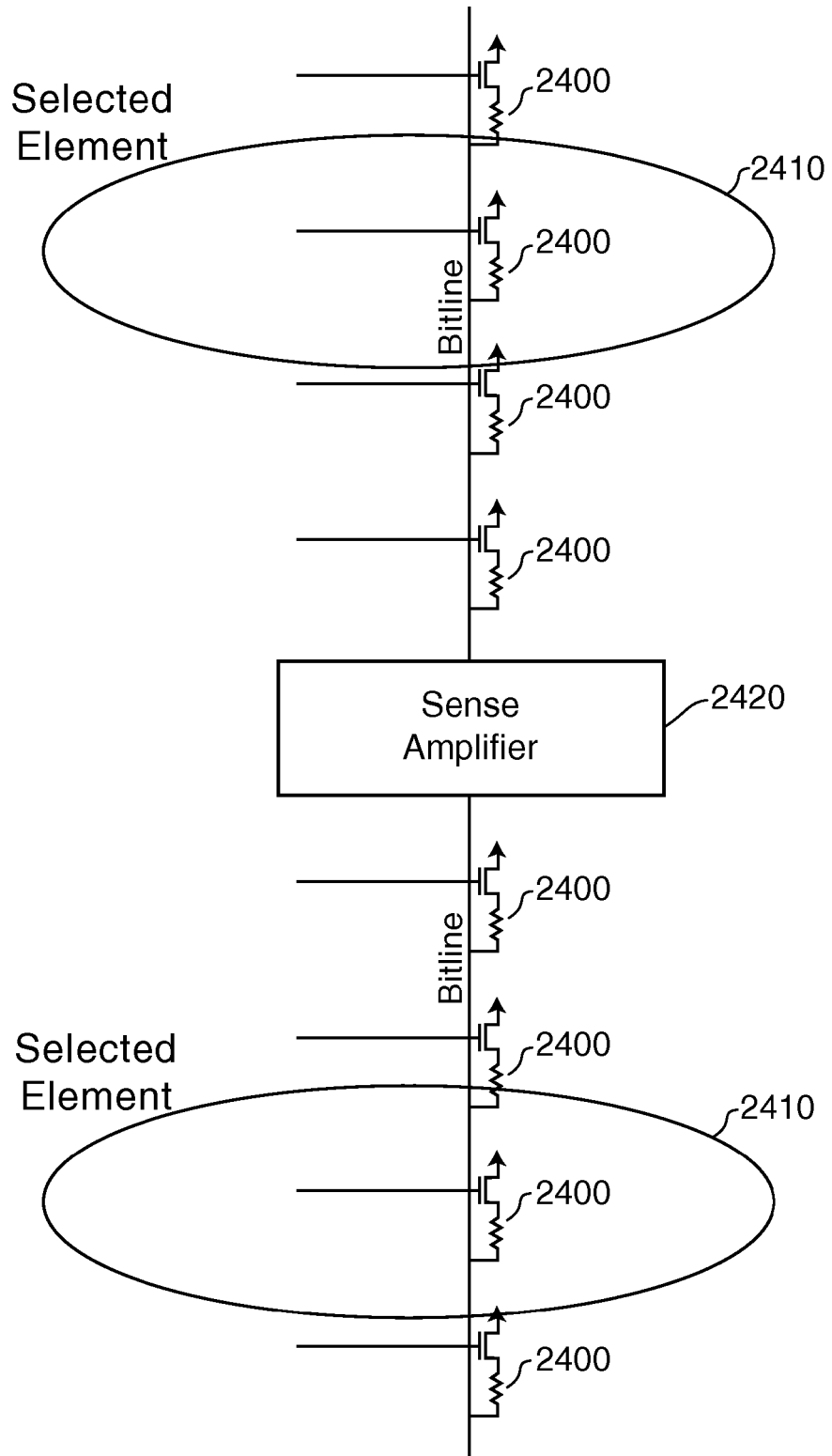
FIG. 2I shows an example of a PCM single ended sensing memory.
Figure 2J:
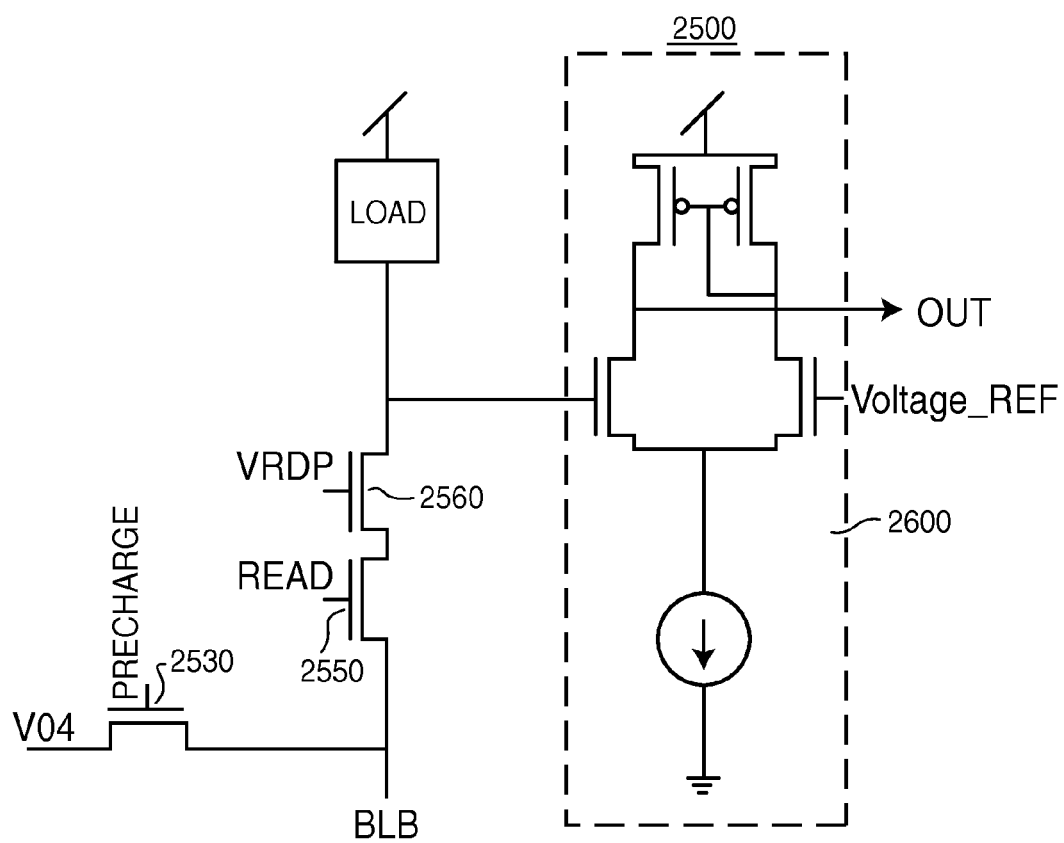
FIG. 2J shows an example of a known PCM single ended sense amplifier.

FIG. 3 shows an example of resistance (R) over time (t) for a PCM cell following a single PCM write event at time t=0. The reset resistance curve 2400 and set resistance curve 2410 are as described with respect to FIG. 2H (and, as in FIG. 2H, describe approximate behavior of one PCM material composition; other PCM compositions may behave differently). However, in FIG. 3, a sense margin critical threshold 310, and a trigger resistance 320 $R_T$ corresponding to the sense margin critical threshold 310, are also shown. Once the reset resistance drifts down sufficiently, it drifts past the trigger resistance 320, and reduces the sense margin between set resistance and reset resistance below the sense margin critical threshold 310, thus requiring refresh. Once reset resistance drift sufficient to require refresh is detected (e.g., by sense amplifiers 460 in the embodiment shown in FIG. 4), a refresh is triggered.

Once the refresh is completed, resistances are re-initialized to their values at t=0, without any drift.

Figure 4:
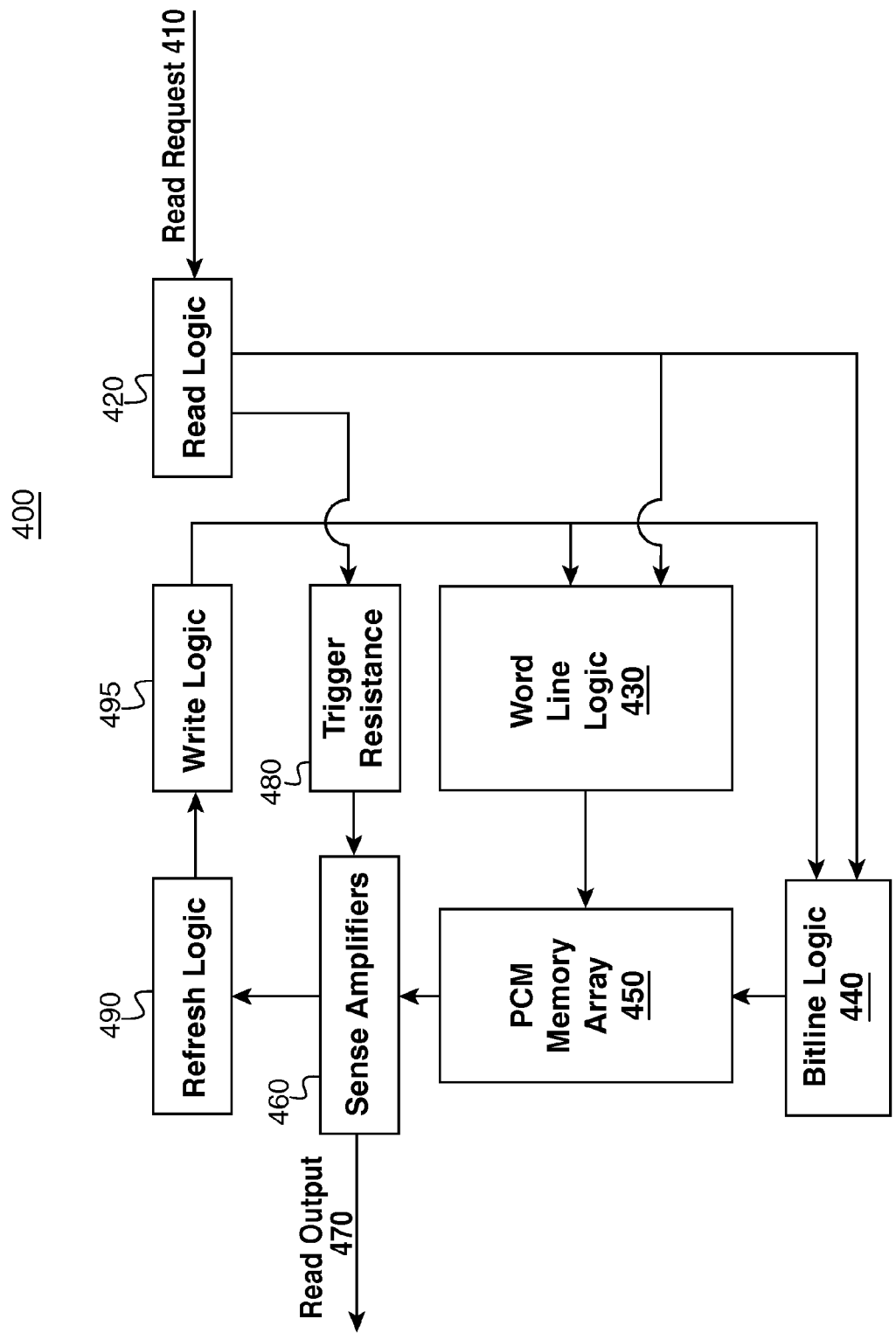
FIG. 4 schematically shows an example of a PCM memory.

FIG. 4 schematically shows an example of a PCM memory 400. A read request 410 is received by read logic 420, which interprets the read request 410 and communicates with word line logic 430 and bit line logic 440 to activate corresponding word lines and bit lines to access a requested word of PCM memory in a PCM memory array 450. The PCM memory output is read by sense amplifiers 460, and the resulting logical values are output as read output 470. In some embodiments, current outputs of pairs of PCM cells known to store opposite logical values are compared to each other by the sense amplifiers 460 to determine whether the sense margin has fallen below a critical threshold.

In other embodiments, one or more current outputs of PCM cells is also compared by the sense amplifiers 460 to output from a trigger resistance 480.

If a pair of PCM cell resistances is determined to have drifted past the sense margin critical threshold, or a PCM cell resistance is determined to have drifted past the trigger resistance 480 (depending on the embodiment), then a refresh logic 490 causes a write logic 495 to refresh some or all of the PCM memory array, e.g., the contents of the accessed word or the subarray (e.g., a tile) corresponding to the accessed word.

Figure 5:
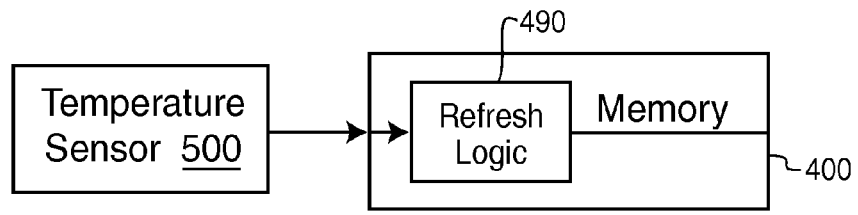
FIG. 5 shows an example of a memory system.

FIG. 5 shows an example of a memory system. A temperature sensor 500 (which can also be incorporated into the memory 400) is used to determine ambient or operating temperature of the memory 400. The resulting temperature values are processed by refresh logic 490, e.g., by comparing the temperature values directly to a threshold, or by integrating the temperature values over time until a threshold is passed. Once the temperature threshold is reached, the refresh logic 490 causes a PCM refresh.

Figure 6:
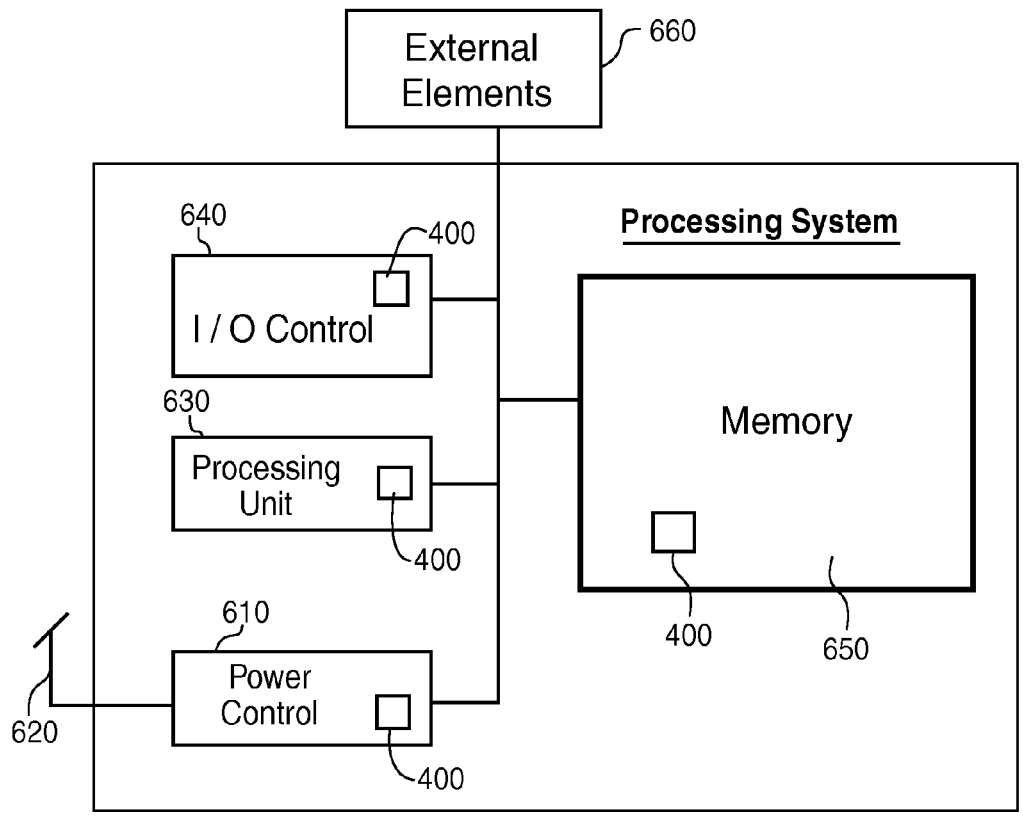
FIG. 6 shows an example of a processing system.

FIG. 6 shows an example of a processing system 600. Power control 610 manages distribution of power from a power source 620 to other components of the processing system. A processing unit 630 performs processing functions, and an I/O control 640 (input/output) operates and manages communications with, and enables other processing system components 610, 630, 640, 650 to operate and manage communications with, external elements 660. The power control 610, processing unit 630 and I/O control 640 can also make memory access calls to a memory 650. Memory 650 can be a PCM memory 400, and/or can contain an embedded PCM memory 400. Processing system components 610, 630, 640, 650 perform their functions based on configuration data stored by non-volatile PCM memory 400 integrated into respective processing system components 610, 630, 640, 650. PCM cells in said PCM memory 400 are refreshed as needed as disclosed herein, e.g., with respect to FIGS. 1, 3, 4, 5 and 8.

Configuration data can be loaded into volatile memory for runtime accesses. Configuration data can be used to tune PCRAM and other component (e.g., power control 610, processing unit 630, I/O control 640 or memory 650) behavior in a design, test, or as-manufactured context. Configuration data can comprise, for example, information used by processing system components to operate external elements 660; redundancy information, used to redirect accesses (read and write requests) from defective or otherwise inoperative memory cells to redundant (backup) memory cells; trigger resistance (s) as disclosed herein; trim information, generally used to alter the state of an existing topology when device features as-manufactured show variation—which can be expected within some degree of statistical distribution—that can be corrected using measures built into the device; test information used to implement test functions, e.g., for device design, design testing or as-manufactured quality assurance purposes; or to change timing (e.g., sense amp timing, or setup and hold timing in a data path), internal supply voltages, whether ECC (error correction) or other memory or other component functionality is activated, or other component operation parameters (such as word length or instruction set).

Figure 7:
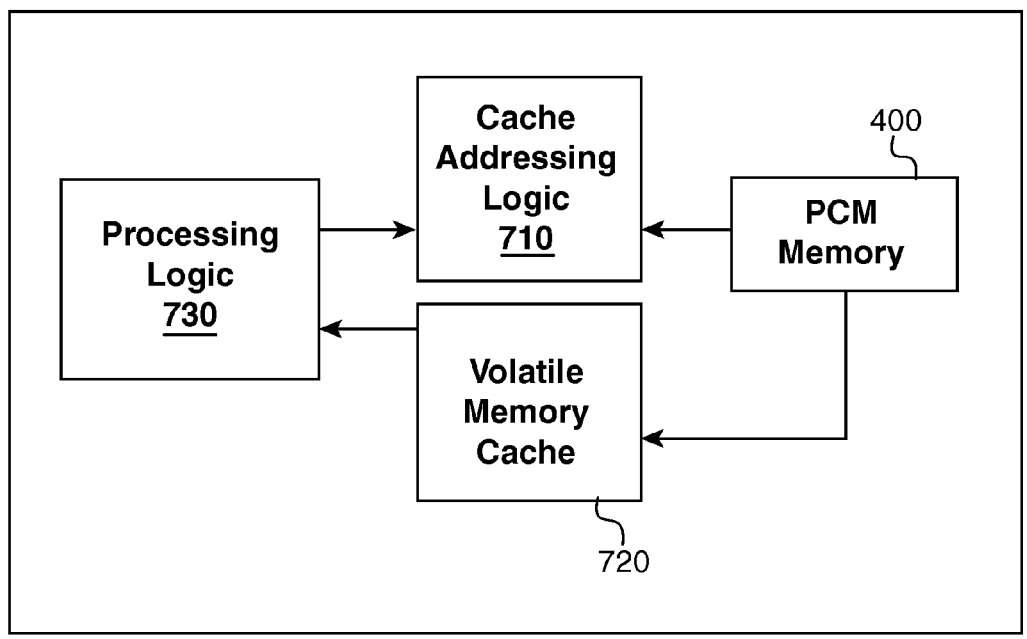
FIG. 7 shows an example of a processing unit.

FIG. 7 shows an example of a processing unit 700, which can be configured as a processing unit 630. After power-on, once sufficient voltage is available for reliable reads, a PCM memory 400 loads repair information (e.g., configuration information or a machine execution state from a previous power-down event) into volatile memory in cache addressing logic 710 or into volatile memory cache 720 (e.g., as an initial cache state on startup). The cache addressing logic 710 controls volatile cache 720 to respond to cache memory requests from processing logic 730. Processor configuration information can include, for example, any processor operation parameters amenable to adjustment at runtime.

In some embodiments, a PCM memory 400 can be used in place of a volatile memory cache 720.

Power control 610 and I/O control 640 can also be configured as shown in FIG. 7. A power control 610 or I/O control 640 is generally equivalent to a specialized processor, with power control logic or I/O control logic corresponding to processing logic.

Figure 8:
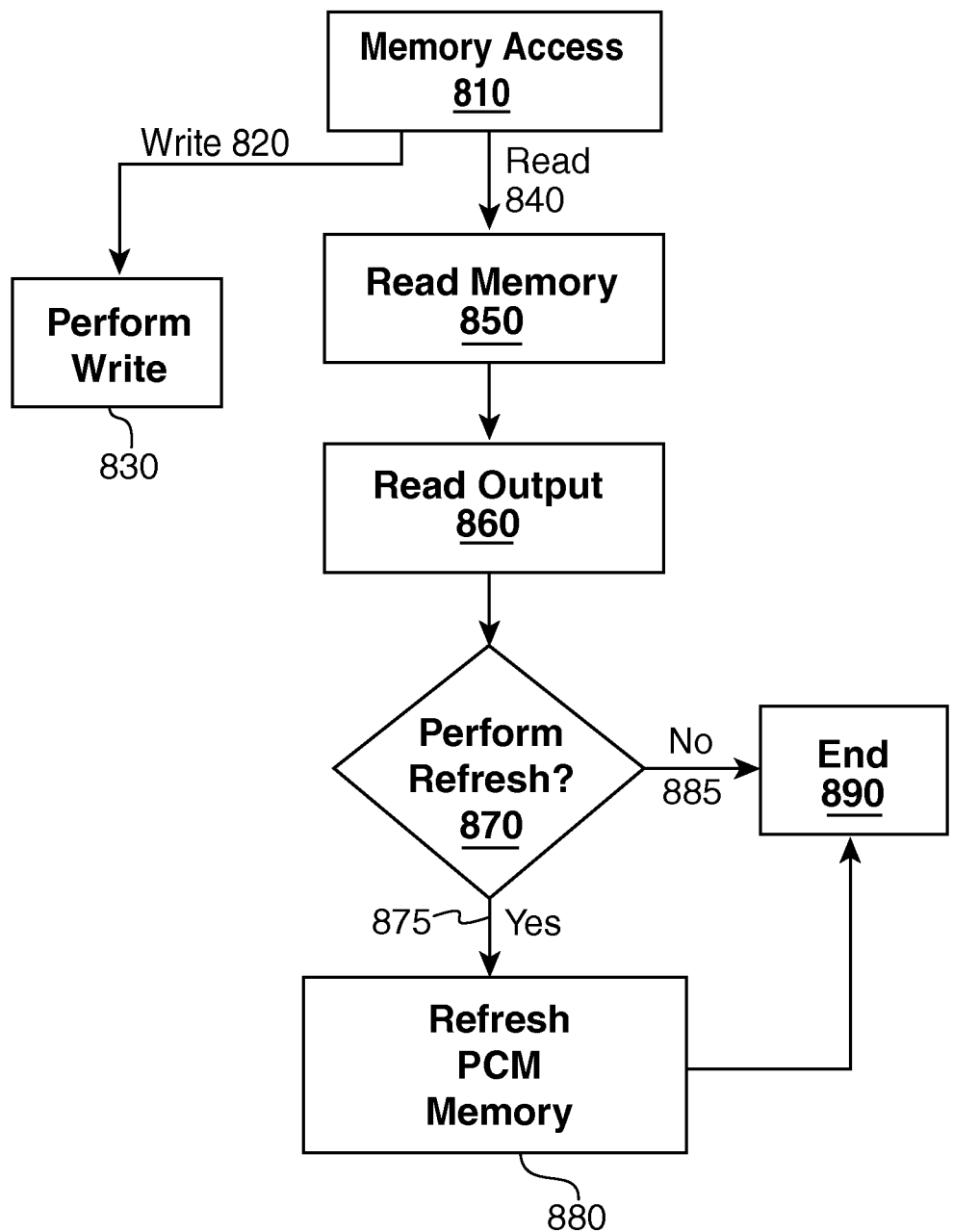
FIG. 8 shows an example of a PCM memory refresh process.

FIG. 8 shows an example of a PCM memory refresh process. When a PCM memory 400 receives a memory access request 810, if the request is for a write 820, the write is performed 830 (which, generally, resets time to t=0 in the context of FIG. 3). If the request is for a read 840, then the corresponding word(s) of PCM memory is read 850 and the result is outputted 860. PCM element read outputs that are sensed to correspond to reset values (or also to set values, if the PCM material exhibits significant set resistance drift) are then compared to a read output from a trigger resistance (or a set resistance read output is differentially compared to a reset resistance read output) to determine whether a refresh needs to be performed 870. If the comparison shows that resistance drift of the tested read output has progressed past the trigger resistance 875 (or that such resistance drift has narrowed the sense margin past a critical level) then a PCM memory refresh is performed 880. Otherwise 885 (and after PCM memory refresh) the process ends and a new event triggering a test for whether refresh is required is awaited 890.

Other conditions can be used to trigger the refresh process. For example, in memories which store error check and correction data (ECC) or cyclic redundancy check data (CRC), an error detection can be used to either launch immediate refresh, or else to shorten the current estimate of remaining lifetime.

According to some but not necessarily all embodiments, there is provided: A method for operating a memory, comprising: reading values stored by multiple phase change memory test cells, at least one of said test cells storing a reset value, and at least one of said test cells storing a set value; comparing reset read results of test cells storing reset values with set read results of test cells storing set values; if said comparing results in a sense margin between said reset read results and said set read results below a chosen threshold, refreshing the values stored by said test cells and by multiple phase change memory storage cells.

According to some but not necessarily all embodiments, there is provided: A method for operating a memory, comprising: reading values stored by one or more phase change memory cells; reading a value of at least one resistive element, said resistive element having a resistance corresponding to an amount of resistance drift in phase change memory cells storing reset values, said amount chosen to trigger refresh of values stored by said phase change memory cells; comparing said read values stored by said phase change memory cells to a read value of said resistive element; writing pre-drift resistance levels, corresponding to said read values, to said phase change memory cells when said compare indicates that said amount of resistance drift has occurred.

According to some but not necessarily all embodiments, there is provided: A memory, comprising: multiple phase change memory cells, at least some of said phase change memory cells being configured as data-storing cells, at least some of said phase change memory cells being configured as test cells, said test cells being configured such that at least one of said test cells stores a reset value, and at least one of said test cells stores a set value; a read logic configured to read values stored by said test cells; a sense amplifier configured to compare reset read results of test cells storing reset values with set read results of test cells storing set values; and a write logic configured to refresh the values stored by said test cells and by said storage cells if said comparing results in a sense margin between said reset read results and said set read results below a chosen threshold.

According to some but not necessarily all embodiments, there is provided: A memory, comprising: multiple phase change memory cells; at least one resistive element with a resistance corresponding to an amount of resistance drift in phase change memory cells storing reset values, said amount chosen to trigger refresh of values stored by said phase change memory cells; a read logic configured to read said values stored by said phase change memory cells and to read said resistive element; at least one sense amplifier configured to compare said read values to a read value of said resistive element; and a write logic configured to write pre-drift resistance levels, corresponding to said read values, to said phase change memory cells when said compare indicates that said amount of resistance drift has occurred.

According to some but not necessarily all embodiments, there is provided: A method of operating a processing system, comprising: reading values stored by multiple phase change memory test cells, at least one of said test cells storing a reset value, and at least one of said test cells storing a set value; comparing reset read results of test cells storing reset values with set read results of test cells storing set values; if said comparing results in a sense margin between said reset read results and said set read results below a chosen threshold, refreshing the values stored by said test cells and by multiple phase change memory storage cells within ones of multiple words within a phase change memory unit, said phase change memory storage cells configured to store configuration data; and operating external elements, using a processor and/or an input/output unit, in accordance with said configuration data.

According to some but not necessarily all embodiments, there is provided: A method of operating a processing system, comprising: reading values stored by one or more phase change memory cells within ones of multiple words within a phase change memory unit, multiple ones of said words configured to store configuration data; reading a value of at least one resistive element, said resistive element having a resistance corresponding to an amount of resistance drift in phase change memory cells storing reset values, said amount chosen to trigger refresh of values stored by said phase change memory cells; comparing said read values stored by said phase change memory cells to a read value of said resistive element; writing pre-drift resistance levels, corresponding to said read values, to said phase change memory cells when said compare indicates that said amount of resistance drift has occurred; and operating external elements, using a processor and/or an input/output unit, in accordance with said configuration data.

According to some but not necessarily all embodiments, there is provided: A processing system, comprising: one or more memory units, one or more processors which execute programmable instruction sequences, and one or more input/output units; a phase change memory unit; multiple words of phase change memory cells within said phase change memory unit configured to store and output configuration data; multiple phase change memory test cells within said phase change memory unit configured such that at least one of said test cells stores a reset value, and at least one of said test cells stores a set value; a read logic configured to read values stored by said phase change memory test cells; a sense amplifier configured to compare reset read results of test cells storing reset values with set read results of test cells storing set values; and a write logic configured to write to said phase change memory cells and to refresh the values stored by said test cells and by said array of cells if said comparing results in a sense margin between said reset read results and said set read results below a chosen threshold; wherein said processor and/or said input/output unit operate external elements in accordance with said configuration data.

According to some but not necessarily all embodiments, there is provided: A processing system, comprising: one or more memory units, one or more processors which execute programmable instruction sequences, and one or more input/output units; a phase change memory unit; multiple words of phase change memory cells within said phase change memory unit configured to store and output configuration data; at least one resistive element with a resistance corresponding to an amount of resistance drift in phase change memory cells storing reset values, said amount chosen to trigger refresh of data values stored by said phase change memory cells; a read logic configured to read said data values stored by said phase change memory cells and to read said resistive element; at least one sense amplifier configured to compare said read data values to a read value of said resistive element; and a write logic configured to write to said phase change memory cells and to write pre-drift resistance levels, corresponding to said read values, to said phase change memory cells when said compare indicates that said amount of resistance drift has occurred; wherein said processor and/or said input/output unit operate external elements in accordance with said configuration data.

According to some but not necessarily all embodiments, there is provided: Systems in which PCM is used, including memory systems, as well as methods for operating such systems. A comparison of PCM memory elements storing logical values to a trigger resistance or to each other can be used to determine the extent of resistance drift since the PCM memory elements were last written. If the comparison determines that the resistance drift has passed the threshold indicated by the trigger resistance, a memory refresh is triggered and pre-drift resistances corresponding to the stored logical values are written to the PCM memory elements.

According to some but not necessarily all embodiments, there is provided: A memory, comprising: a) multiple phase change memory cells; b) at least one resistive element with a resistance corresponding to an amount of resistance drift in phase change memory cells storing reset values, said amount chosen to trigger refresh of values stored by said phase change memory cells; c) read logic configured to read said values stored by said phase change memory cells and to read said resistive element; d) at least one sense amplifier configured to compare said read values to a read value of said resistive element; and e) write logic configured to restore said phase change memory cells to providing pre-drift resistance levels when said compare indicates that said amount of resistance drift has occurred.

According to some but not necessarily all embodiments, there is provided: A method of operating a processing system, comprising: a) reading values stored by one or more phase change memory cells within ones of multiple words within a phase change memory unit, multiple ones of said words configured to store configuration data; b) reading a value of at least one resistive element, said resistive element having a resistance corresponding to an amount of resistance drift in phase change memory cells storing reset values, said amount chosen to trigger refresh of values stored by said phase change memory cells; c) comparing said read values stored by said phase change memory cells to a read value of said resistive element; d) writing said phase change memory cells to again provide pre-drift resistance levels when said compare indicates that said amount of resistance drift has occurred; and e) operating external elements, using a processor and/or an input/output unit, in accordance with said configuration data.

According to some but not necessarily all embodiments, there is provided: A memory in which a comparison of PCM memory elements storing logical values to a trigger resistance or to each other can be used to determine the extent of resistance drift since the PCM memory elements were last written. If the comparison determines that the resistance drift has passed a sense margin threshold or a trigger resistance, a memory refresh is triggered and pre-drift resistances corresponding to the stored logical values are written to the PCM memory elements.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some embodiments, PCM memory refresh can be triggered at regular time intervals as determined by an outside source, such as a memory controller or executed software.

In some embodiments, PCM memory refresh can be triggered at or after unique events such as packaging or soldering, as determined by an outside source such as a memory controller, executed software or manufacturing test equipment.

In some embodiments, PCM memory refresh can be triggered at internally timed intervals. Generally, this requires a system into which the memory is incorporated to have continuous power, which is non-optimal when PCM is used as non-volatile storage. However, always-on memory is a reasonable expectation where PCM is used in place of a volatile memory technology such as DRAM.

In some embodiments, PCM memory refresh can be triggered at moments of opportunity during normal operation of the chip. For example, a hidden refresh can be triggered for one area of a PCM memory during long write cycles triggered by writes to other areas of the PCM memory.

In some embodiments, PCM memory refresh can be triggered during power-on, if the memory specification allows for enough time or the system permits delaying a chip-ready signal long enough to execute a refresh.

In some embodiments, PCM memory refresh can be triggered by sensing the need for a refresh through reading of a single or a multitude of reference elements with known content at various or predetermined read resistance settings of the sense amplifier.

In some embodiments, PCM memory refresh can be triggered by sensing the need for refresh through comparison of a single or a multitude of reference elements with discrete resistor values. This can be achieved sequentially or in a differential/comparative manner.

In some embodiments, PCM memory refresh can be triggered by sensing the need for refresh through integration of the temperature profile and other cell content disturbing events. Cell content disturbing events can include, for example, frequent read events, and write events which could impact cell resistance. Integration of the temperature profile generally requires that power to the PCM memory (or at least to the system into which the PCM memory is incorporated) is substantially continuous, or that the PCM memory is maintained at relatively cool temperatures during power-off.

In some embodiments, more than one word of PCM memory is refreshed substantially contemporaneously.

In some embodiments, a single comparison between a PCM cell read output and a trigger resistance that indicates resistance drift of the PCM cell has passed the trigger resistance threshold results in a PCM refresh.

In some embodiments, multiple comparisons between PCM cell read outputs and a trigger resistance that indicate resistance drift of the PCM cells has passed the trigger resistance threshold is required to trigger PCM refresh.

In some embodiments, PCM refresh is delayed after being triggered until one or more PCM memory operations (preferably PCM read operations, which are generally much faster than PCM write operations), e.g., queued memory operations, are completed.

In some embodiments, read outputs of PCM cells with known logical values are compared to a trigger resistance or to each other to determine whether a refresh is required.

In some embodiments, logical values corresponding to read outputs of PCM cells are determined by sense amplifiers prior to comparing the read outputs compared to a trigger resistance or to each other to determine whether a refresh is required.

Additional general background, which helps to show variations and implementations, may be found in the following publications, all of which are hereby incorporated by reference:

In some embodiments, single-ended sensing is used to compare PCM read outputs to a trigger resistance.

In some embodiments, differential sensing is used to compare PCM read outputs to a trigger resistance.

In some embodiments, different trigger resistances are used in different memory areas.

In some embodiments, differential sensing is used to compare PCM memory elements with known stored logical values to determine whether a sense margin is below a threshold level.

In some embodiments, tristate differential sensing can be used to compare PCM memory elements with known stored logical values to determine whether a sense margin is below a threshold level.

In some embodiments with PCM material compositions that display significant set resistance drift, set resistance is compared to a trigger set resistance to determine whether refresh is required.

In some embodiments, multiple pairs of PCM test cells are used to determine whether refresh is necessary.

In some embodiments, a refresh is triggered by an event without performing a test to determine whether PCM cells have experienced more than a threshold amount of resistance drift.

Additional general background, which helps to show variations and implementations, may be found in the following publications, all of which are hereby incorporated by reference: Lam, Chung. "Phase Change Memory: A Replacement or Transformational Memory Technology," IEEE Workshop on Microelectronics and Electron Devices (WMED), c. 2011. Choi, Youngdon, et al. "A 20 nm 1.8V 8 Gb PRAM with 40 MB/s Program Bandwidth." ISSCC 2012/Session 2/High Bandwidth DRAM & PRAM/2.5. c. 2012.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method of operating a processing system, comprising:
   a) reading values stored by multiple phase change memory test cells, at least one of said test cells storing a reset value, and at least one of said test cells storing a set value;
   b) comparing reset read results of test cells storing reset values with set read results of test cells storing set values;

c) if said comparing results in a sense margin between said reset read results and said set read results below a chosen threshold, refreshing the values stored by said test cells and by multiple phase change memory storage cells within ones of multiple words within a phase change memory unit, said phase change memory storage cells configured to store configuration data; and d) operating external elements, using a processor and/or an input/output unit, in accordance with said configuration data.

2. The method of operating a processing system of claim 1, wherein said refreshing is also performed at regular time intervals as determined by a memory controller or by a programmable instruction sequence executed by said processor.

3. The method of operating a processing system of claim 1, wherein said refreshing is also performed when packaging or soldering is determined to have occurred proximally to the memory by a memory controller, a programmable instruction sequence executed by said processor or by manufacturing test equipment.

4. The method of operating a processing system of claim 1, wherein said refreshing is also performed at intervals timed internally by said phase change memory unit or by a timer elsewhere in the processing system.

5. The method of operating a processing system of claim 1, wherein said refreshing is also performed on phase change memory cells in an area of said phase change memory unit during write cycles triggered by writes to phase change memory cells in another area of said phase change memory unit.

6. The method of operating a processing system of claim 1, wherein said refreshing is also performed during memory power-on.

7. The method of operating a processing system of claim 1, said refreshing is also performed when an integration of a temperature profile detected by a temperature sensor increases beyond a threshold value.

8. A method of operating a processing system, comprising:
a) reading values stored by one or more phase change memory cells within ones of multiple words within a phase change memory unit, multiple ones of said words configured to store configuration data;

b) reading a value of at least one resistive element, said resistive element having a resistance corresponding to an amount of resistance drift in phase change memory cells storing reset values, said amount chosen to trigger refresh of values stored by said phase change memory cells;

c) comparing said read values stored by said phase change memory cells to a read value of said resistive element;

d) writing said phase change memory cells to again provide pre-drift resistance levels when said compare indicates that said amount of resistance drift has occurred; and e) operating external elements, using a processor and/or an input/output unit, in accordance with said configuration data.

9. The processing system of claim 8, wherein said writing pre-drift resistance levels is also performed at regular time intervals as determined by a memory controller or by a programmable instruction sequence executed by said processor.

10. The processing system of claim 8, wherein said writing pre-drift resistance levels is also performed when packaging or soldering is determined to have occurred proximally to the memory by a memory controller, a programmable instruction sequence executed by said processor or by manufacturing test equipment.

11. The processing system of claim 8, wherein said writing pre-drift resistance levels is also performed at intervals timed internally by said phase change memory unit or by a timer elsewhere in the processing system.

12. The processing system of claim 8, wherein said writing pre-drift resistance levels is also performed on phase change memory cells in an area of said phase change memory unit during write cycles triggered by writes to phase change memory cells in another area of said phase change memory unit.

13. The processing system of claim 8, wherein said writing pre-drift resistance levels is also performed during memory power-on.

14. The processing system of claim 8, said writing pre-drift resistance levels is also performed when an integration of a temperature profile detected by a temperature sensor increases beyond a threshold value.

15. A processing system, comprising:
a) one or more memory units, one or more processors which execute programmable instruction sequences, and one or more input/output units;

b) a phase change memory unit;

c) multiple words of phase change memory cells within said phase change memory unit configured to store and output configuration data;

d) multiple phase change memory test cells within said phase change memory unit configured such that at least one of said test cells stores a reset value, and at least one of said test cells stores a set value;

e) a read logic configured to read values stored by said phase change memory test cells;

f) a sense amplifier configured to compare reset read results of test cells storing reset values with set read results of test cells storing set values; and g) a write logic configured to write to said phase change memory cells and to refresh the values stored by said test cells and by said array of cells if said comparing results in a sense margin between said reset read results and said set read results below a chosen threshold;

h) wherein said processor and/or said input/output unit are configured to operate external elements in accordance with said configuration data.

16. The processing system of claim 15, wherein said write logic is further configured to perform said refresh at regular time intervals as determined by a memory controller or by a programmable instruction sequence executed by said processor.

17. The processing system of claim 15, wherein said write logic is further configured to perform said refresh when packaging or soldering is determined to have occurred proximally to the memory by a memory controller, a programmable instruction sequence executed by said processor or by manufacturing test equipment.

18. The processing system of claim 15, wherein said write logic is further configured to perform said refresh at intervals timed internally by said phase change memory unit or by a timer elsewhere in the processing system.

19. The processing system of claim 15, wherein said write logic is further configured to perform said refresh on phase change memory cells in an area of said phase change memory unit during write cycles triggered by writes to phase change memory cells in another area of said phase change memory unit.

20. The processing system of claim 15, wherein said write logic is further configured to perform said refresh during memory power-on.

* * * * *